(12) United States Patent
Han et al.

(10) Patent No.: US 11,581,749 B2
(45) Date of Patent: Feb. 14, 2023

(54) ELECTRONIC DEVICE AND CHARGING METHOD OF ELECTRONIC DEVICE

(71) Applicant: Samsung Display Co., Ltd., Yongin-Si (KR)

(72) Inventors: Chanhui Han, Seongnam-si (KR); Sungsang Ahn, Hwaseong-si (KR); Hyun Chul Jeong, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 236 days.

(21) Appl. No.: 17/141,573

(22) Filed: Jan. 5, 2021

(65) Prior Publication Data
US 2021/0336456 A1 Oct. 28, 2021

(30) Foreign Application Priority Data
Apr. 24, 2020 (KR) .................. 10-2020-0050013

(51) Int. Cl.
*H01M 10/44* (2006.01)
*H01M 10/46* (2006.01)
*H02J 7/00* (2006.01)
*H02J 50/10* (2016.01)
*H02J 50/00* (2016.01)
*H02J 50/70* (2016.01)
*H05K 5/02* (2006.01)
*H02J 7/04* (2006.01)
(Continued)

(52) U.S. Cl.
CPC ........ *H02J 7/0042* (2013.01); *H02J 7/00032* (2020.01); *H02J 7/04* (2013.01); *H02J 50/005* (2020.01); *H02J 50/10* (2016.02); *H02J 50/70* (2016.02); *H02J 50/80* (2016.02); *H05K 5/0017* (2013.01); *H05K 5/0217* (2013.01)

(58) Field of Classification Search
CPC ........ H02J 7/0042; H02J 7/04; H02J 7/00032; H02J 7/0047; H02J 50/80; H02J 50/10; H02J 50/005; H02J 50/70
USPC .................. 320/107, 108, 114, 115, 149
See application file for complete search history.

(56) References Cited

U.S. PATENT DOCUMENTS

| 10,136,524 B2 | 11/2018 | Choi et al. |
| 2018/0014417 A1 | 1/2018 | Seo et al. |
| 2019/0312451 A1 | 10/2019 | An et al. |

FOREIGN PATENT DOCUMENTS

| KR | 1020180006533 A | 1/2018 |
| KR | 1020180018941 A | 2/2018 |

(Continued)

*Primary Examiner* — Edward Tso
(74) *Attorney, Agent, or Firm* — Cantor Colburn LLP

(57) ABSTRACT

An electronic device includes a display module including a first region exposed to an outside in first and second modes and a second region extending from the first region, where the second region is partially opposite to the first region in the first mode or is partially exposed in the second mode, the second region includes a curved region in the first mode and a flat region extending from the curved region and opposite to the first region, a supporting member disposed below the display module, a case which contains the display module and the supporting member, where the first and second modes are determined based on a sliding motion of the case, and a wireless charging coil which is contained in the case and shielded by the supporting member in the first mode, and does not overlap the supporting member in the second mode.

20 Claims, 12 Drawing Sheets

(51) Int. Cl.
*H05K 5/00* (2006.01)
*H02J 50/80* (2016.01)

(56) References Cited

FOREIGN PATENT DOCUMENTS

| KR | 1020190115888 A | 10/2019 | | |
|----|----|----|----|----|
| KR | 1020190118058 A | 10/2019 | | |
| WO | WO-2022108125 A1 | * | 5/2022 | ................ H02J 7/07 |

* cited by examiner

ELECTRONIC DEVICE AND CHARGING METHOD OF ELECTRONIC DEVICE

This application claims priority to Korean Patent Application No. 10-2020-0050013, filed on Apr. 24, 2020, and all the benefits accruing therefrom under 35 U.S.C. § 119, the content of which in its entirety is herein incorporated by reference.

BACKGROUND

1. Field

The disclosure relates to an electronic device and a method of charging the electronic device, and in particular, to a slidable electronic device, which can be charged in a wireless manner, and a method of charging the slidable electronic device.

2. Description of the Related Art

With the development of technology, a wireless charging technology capable of charging a battery in a wireless manner has been commercialized. In the wireless charging technology, when an electronic device is just placed on a charging pad, the battery of the electronic device can be charged, without any additional charging connector, in a wireless power transmission/reception manner. The wireless charging technologies include an inductive charging technology using a coil, a resonant inductive coupling technology using resonance, or a microwave technology converting an electric energy to a microwave.

SUMMARY

An embodiment of the invention provides a slidable electronic device, which is configured to allow for a wireless charging and to prevent a curved deformation issue from occurring on a display panel during a sliding motion.

According to an embodiment of the invention, an electronic device includes a display module including a first region, which is exposed to an outside in a first mode and a second mode, and a second region extending from the first region, where a portion of the second region is opposite to the first region in the first mode, a portion of the second region is exposed to the outside in the second mode, and the second region includes a curved region having a specific curvature in the first mode and a flat region extending from the curved region and opposite to the first region, a supporting member disposed below the display module to support the display module, a case which contains the display module and the supporting member, where the first mode and the second mode are determined based on a sliding motion of the case, and a wireless charging coil contained in the case, where the wireless charging coil is shielded by the supporting member in the first mode, and does not overlap the supporting member in the second mode.

In an embodiment, the supporting member may include a first supporting portion overlapping the first region and a second supporting portion overlapping the second region. In such an embodiment, the second supporting portion may face the first supporting portion, and the second supporting portion may include a metal plate.

In an embodiment, the wireless charging coil may overlap the first supporting portion and the second supporting portion in the first mode, and the wireless charging coil may overlap the first supporting portion and not overlap the second supporting portion in the second mode.

In an embodiment, the wireless charging coil may be inactivated when the wireless charging coil is shielded by the metal plate, and the wireless charging coil may be activated when the wireless charging coil does not overlap the metal plate.

In an embodiment, the electronic device may further include a wireless charging module electrically connected to the wireless charging coil. In such an embodiment, the wireless charging module may activate the wireless charging coil in the second mode and may inactivate the wireless charging coil in the first mode.

In an embodiment, the electronic device may further include an electronic module electrically connected to the display module and the wireless charging module. In such an embodiment, the electronic module may include a sensor module, which senses whether the electronic device is in the first mode or the second mode to produce state information, and transmits the produced state information to the wireless charging module.

In an embodiment, the sensor module may sense the sliding motion of the case to sense whether the electronic device is in the first mode or the second mode.

In an embodiment, the case may include a first case, to which the display module and the supporting member are fixed and combined, and a second case, which is combined to the first case and is movable toward or away from the first case in a predetermined direction.

In an embodiment, the sensor module may sense that the electronic device is in the second mode when the second case moves away from the first case, and the sensor module may sense that the electronic device is in the first mode when the second case moves toward the first case.

In an embodiment, the wireless charging coil may be fixed and combined to the second case.

In an embodiment, the portion of the second region exposed to the outside in the second mode may correspond to the curved region in the first mode, and the wireless charging coil may overlap the portion of the second region exposed to the outside in the second mode.

In an embodiment, in the first mode, the wireless charging coil may be inactivated by the metal plate and may be inactivated by the wireless charging module.

According to an embodiment of the invention, a method of charging an electronic device, where the electronic device includes a display module, a supporting member which supports the display module, a case which contains the display module and the supporting member, and a wireless charging module, includes sensing a sliding motion of the case, determining whether the case is in a first mode or in a second mode based on the sliding motion thereof, and activating the wireless charging module when the case is in the second mode.

In an embodiment, the electronic device may further include an electronic module connected to the display module and the wireless charging module. In such an embodiment, the electronic module may include a control module which determines whether the case is in the first mode or in the second mode and a sensor module which senses whether the case is in the first mode or in the second mode.

In an embodiment, the determining whether the case is in the first mode or in the second mode may include sensing an external wireless charging device adjacent to the electronic device.

In an embodiment, the case may include a first case, to which the display module and the supporting member are fixed and combined, and a second case, which is combined to the first case and is movable toward or away from the first case in a first direction. In such an embodiment, the determining whether the case is in the first mode or in the second mode may include determining that the case is in the second mode when the second case moves away from the first case and determining that the case is in the first mode when the second case moves toward the first case.

In an embodiment, the method may further include activating a wireless charging coil electrically connected to the wireless charging module.

In an embodiment, the method may further include performing a wireless charging process, in which the electronic device receives an electric power from an external wireless charging device adjacent thereto, when the wireless charging module is activated.

In an embodiment, the performing the wireless charging process may include deforming the display module to flatten a curved portion of the display module, using heat generated in a process of receiving the electric power.

In an embodiment, the supporting member may shield a wireless charging coil, which is electrically connected to the wireless charging module, in the first mode of the case, and the supporting member may not overlap the wireless charging coil in the second mode of the case.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
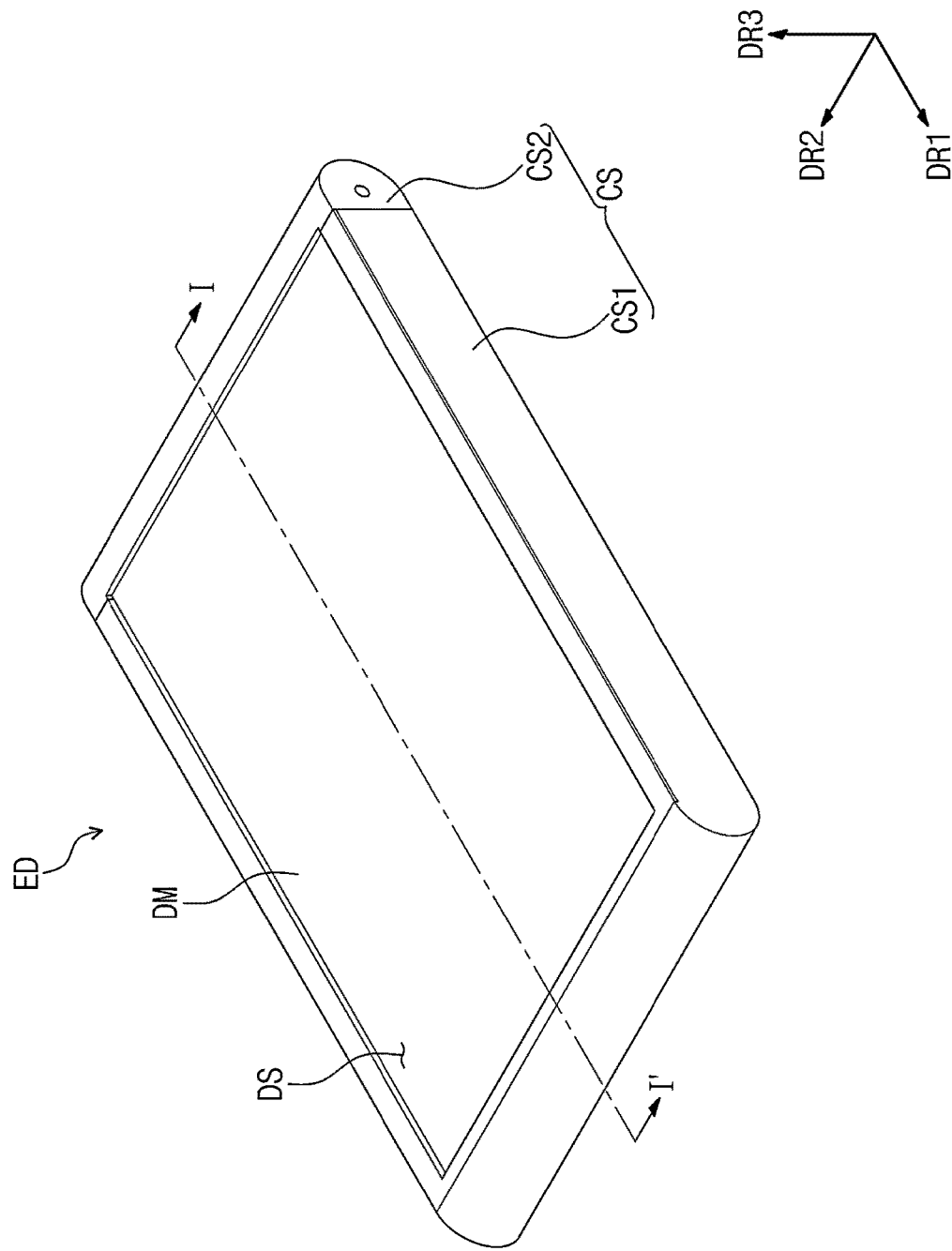
FIG. 1 is a perspective view illustrating an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on, "connected" or "coupled" to another element, it can be directly on, connected or coupled to the other element or intervening elements may be present. In contrast, when an element is referred to as being "directly on", "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which example embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
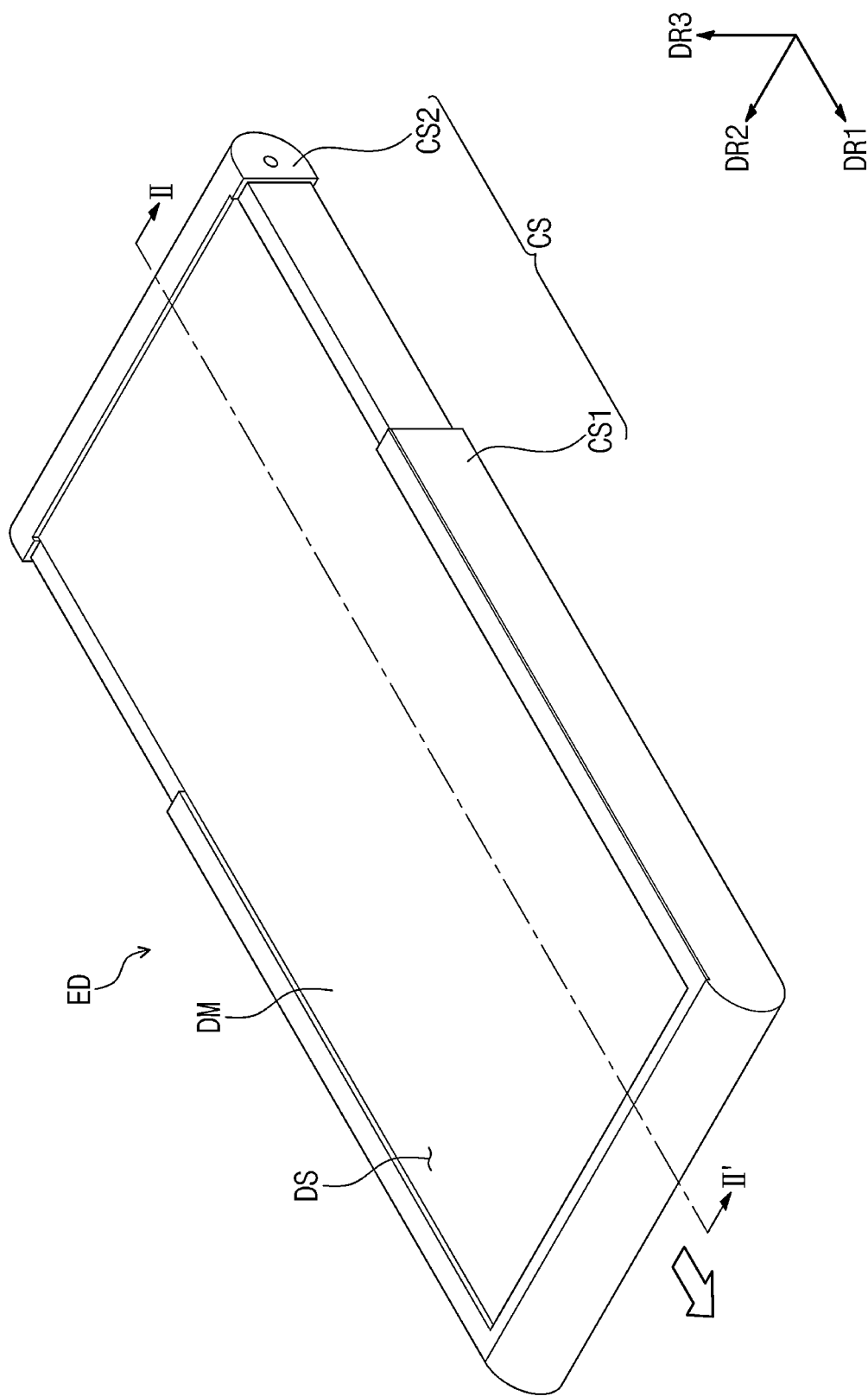
FIG. 2 is a perspective view illustrating a second mode of the electronic device of FIG. 1.

FIG. 1 is a perspective view illustrating an electronic device according to an embodiment of the invention. FIG. 2 is a perspective view illustrating a second mode of the electronic device of FIG. 1.

Referring to FIG. 1, an embodiment of an electronic device ED according to the invention may include a display module DM and a case CS, in which the display module DM is disposed or contained. The display module DM may be exposed to an outside through an opening, which is defined in an upper portion of the case CS.

The case CS may include a first case CS1 and a second case CS2. The first case CS1 and the second case CS2 may be combined to each other to provide a space or a room, in which the display module DM is disposed. The first case CS1 may be combined to the second case CS2 to be movable or in a movable manner in a first direction DR1. FIG. 1 illustrates the electronic device Ed in a first mode, in which the first case CS1 of the electronic device ED is not yet moved. Here, the first mode may be a closed state of the electronic device ED, and a second mode may be an opened state of the electronic device ED.

Hereinafter, a direction crossing the first direction DR1 will be referred to as a second direction DR2. A direction perpendicular to both of the first and second directions DR1 and DR2 will be referred to as a third direction DR3. The third direction DR3 may be a thickness direction of the electronic device ED. Furthermore, herein, the expression "when viewed in a plan view" may mean that a relevant structure is seen in the third direction DR3.

Referring to FIG. 2, an area of a display surface DS of the display module DM (e.g., exposed through the opening of the case CS) may be changed by the motion of the first case CS1. In one embodiment, for example, the display module DM may be a flexible display module and may be supported by a supporting member (e.g., see FIGS. 4A and 4B) disposed below the display module DM. The supporting member may be connected to the first case CS1, and when the first case CS1 is moved in the first direction DR1, the supporting member may be also moved in the first direction DR1. FIG. 2 illustrates the electronic device Ed in the second mode, in which the first case CS1 of the electronic device ED is moved in the first direction DR1.

Although not shown, except for the display surface DS exposed by the opening, a portion of the display module DM, which is not exposed to the outside, may be disposed in the case CS. As a result of the motion of the first case CS1, a size of the display surface DS in the first direction DR1 may be increased. In addition, the display module DM, along with the supporting member thereunder, may be moved in the first direction DR1 by the motion of the first case CS1 to enlarge the display surface DS of the display module DM. Thus, the electronic device Ed may provide an image to a user through an enlarged screen in the second mode.

Hereinafter, the first mode may be defined as a state of the electronic device ED, when the display surface DS of the display module DM is set to a basic or minimum size, as shown in FIG. 1. The second mode may be defined as a state of the electronic device ED, when the display surface DS of the display module DM is enlarged, as shown in FIG. 2. In an embodiment, the first mode of the electronic device ED may correspond to the first mode of the case CS, and the second mode of the electronic device ED may correspond to the second mode of the case CS. When the first case CS1 is moved in the first direction DR1 to enlarge the display surface DS of the display module DM, the case CS may be changed from the first mode to the second mode. In such an embodiment, the case CS may change the electronic device ED from the first mode to the second mode or from the second mode to the first mode.

Figure 3:
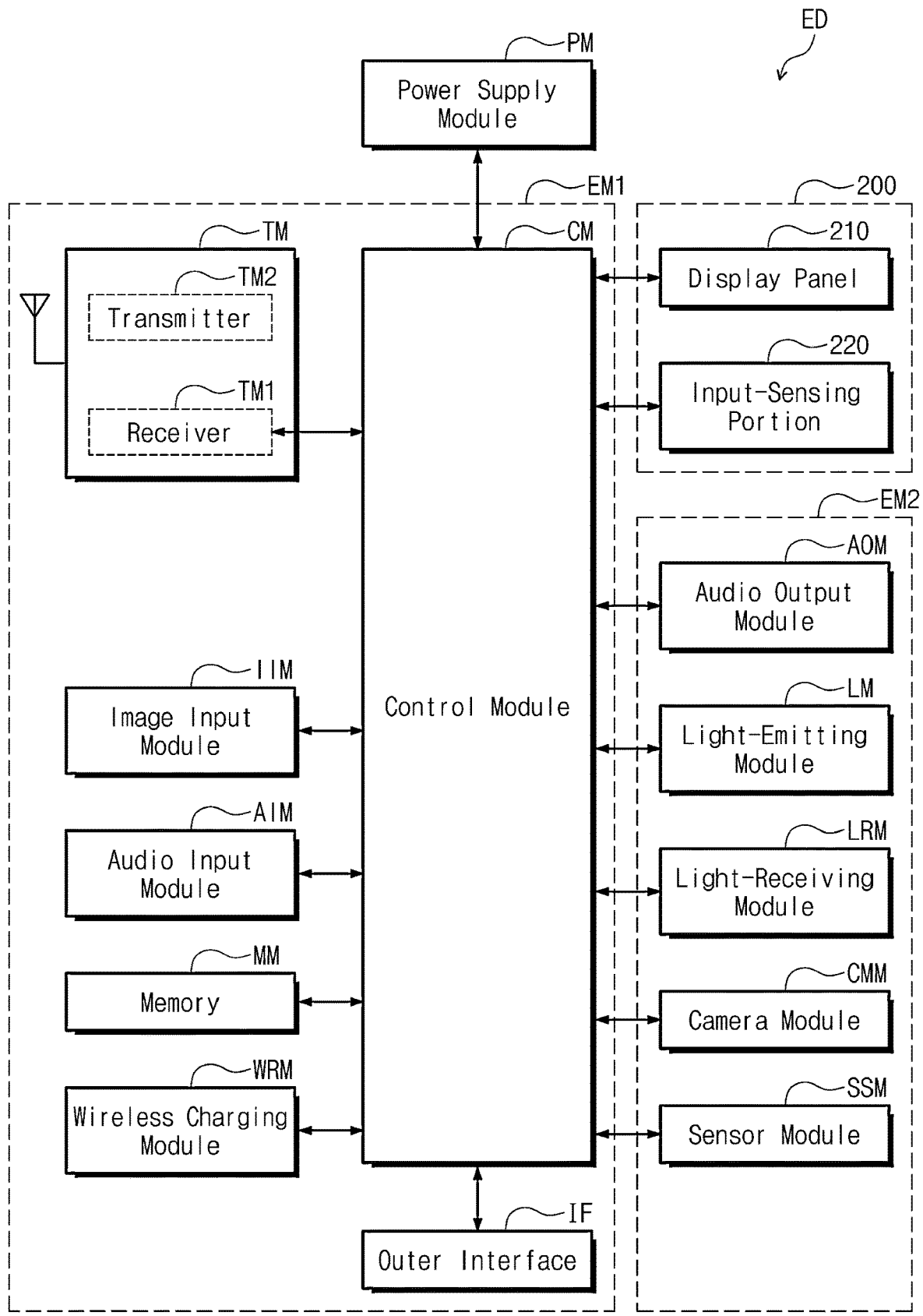
FIG. 3 is a block diagram illustrating an electronic device according to an embodiment of the invention.

FIG. 3 is a block diagram illustrating an electronic device according to an embodiment of the invention.

Referring to FIG. 3, an embodiment of the electronic device ED may include a display module 200, a power supply module PM, and an electronic module EM. The electronic module may include a first electronic module EM1 and a second electronic module EM2. The display module 200, the power supply module PM, the first electronic module EM1, and the second electronic module EM2 may be electrically connected to each other.

The display module 200 may include a display panel 210 and an input-sensing portion 220.

The display panel 210 may be an element that displays the image IM. An image may be displayed on a front surface of the display module 200 and may be provided to an external user through a transmission region.

The input-sensing portion 220 may sense an external input applied from the outside. In one embodiment, for example, the input-sensing portion 220 may sense an external input provided to a window. The external input may be a user's input. In one embodiment, for example, the user's input may include various types of external inputs, such as a part of a user's body, light, heat, pressure, or a pen.

The power supply module PM may supply an electric power, which is used for an overall operation of the electronic device ED, to the electronic device ED. The power supply module PM may include a conventional battery module (not shown).

The electronic module may include at least one of various functional modules, which are used to operate the electronic device ED.

In an embodiment, the first electronic module EM1 may be mounted directly on a motherboard electrically connected to the display module 200. Alternatively, the first electronic module EM1 may be mounted on another substrate and may be electrically connected to the motherboard through a connector (not shown) or the like.

The first electronic module EM1 may include a control module CM, a wireless communication module TM, an image input module IIM, an audio input module AIM, a memory MM, a wireless charging module WRM, and an outer interface IF. At least one of the modules may not be mounted on the motherboard and may be electrically connected to the motherboard through a flexible circuit board.

The control module CM may control an overall operation of the electronic device ED. The control module CM may be a micro-processor. In one embodiment, for example, the control module CM may activate or inactivate the display module 200. The control module CM may control other modules (e.g., the image input module IIM or the audio input module AIM), based on a touch signal received from the display module 200.

In an embodiment, the control module CM may control an operation of the first electronic module EM1 in response to a signal provided from the second electronic module EM2. In one embodiment, for example, the control module CM may receive a signal, which contains information on whether the electronic device ED is in the first mode or the second mode, from a sensor module SSM, and may transmit the signal to the wireless charging module WRM. In such an embodiment, the control module CM may control an operation of the wireless charging module WRM.

The wireless communication module TM may transmit and receive a wireless signal to and from another terminal via a Bluetooth® or a Wi-Fi line. The wireless communication module TM may transmit and receive a voice signal via a typical communication line. The wireless communication module TM may include a transmitter TM1, which modulates and transmits a signal to be transmitted, and a receiver TM2, which demodulates a received signal.

The image input module IIM may process an image signal and convert the image signal into image data that can be displayed on the display module 200. The audio input module AIM may receive an external audio signal through a microphone in a recording mode, a voice recognizing mode, and so forth, and then convert the received audio signal into electrical audio data.

The wireless charging module WRM may control a wireless charging operation of the electronic device ED. The wireless charging module WRM may supply or interrupt an electric power, which is provided from an external charging device to a power supply module RM, to control the wireless charging operation. The wireless charging module WRM may be electrically connected to a wireless charging coil to control the operation of the wireless charging coil. The wireless charging coil will be described in greater detail later with reference to FIGS. 5A to 5B.

In an embodiment, the wireless charging module WRM may be activated or inactivated in response to a signal provided from the control module CM. When the wireless charging module WRM is activated, the wireless charging mode of the electronic device ED may be activated to supply an electric power from a neighboring external charging device to the power supply module RM. When the wireless charging module WRM is inactivated, the wireless charging mode may be inactivated regardless of activation or proximity of the neighboring external charging device.

The wireless charging module WRM may receive information on the first mode or the second mode of the electronic device ED, which is determined by the sensor module SSM, from the control module CM, and such information may be used to activate or inactivate the wireless charging mode. The power supply module PM may receive a power from the neighboring external wireless charging device in a wireless manner, when the wireless charging mode is activated.

The outer interface IF may serve as an interface that is connected to an external charger, a wired/wireless data port, a card socket (e.g., a memory card or a SIM/UIM card), and so forth.

The second electronic module EM2 may include an audio output module AOM, a light-emitting module LM, a light-receiving module LRM, a camera module CMM, the sensor module SSM, and so forth. At least one of the modules may be mounted directly on a motherboard. Alternatively, at least one of the modules may be mounted on another substrate and may be electrically connected to the display module 200 or the first electronic module EM1 through a connector (not shown).

The audio output module AOM may convert audio data, which are transmitted from the wireless communication module TM or are stored in the memory MM, and may output the converted audio data to the outside.

The light-emitting module LM may generate and emit light. In an embodiment, the light-emitting module LM may emit infrared light. The light-emitting module LM may include a light emitting diode ("LED") device. The light-receiving module LRM may sense the infrared light. The light-receiving module LRM may be activated, when an infrared light to be incident thereto has an intensity higher than a reference value. The light-receiving module LRM may include a complementary metal oxide semiconductor ("CMOS") sensor. An infrared light emitted from the light-emitting module LM may be reflected by an external object (e.g., a user's finger or face), and the reflected infrared light may be incident into the light-receiving module LRM. The camera module CMM may be used to obtain an image of an external object.

The sensor module SSM may include at least one of various kinds of sensors for sensing various kinds of signals. The sensor module SSM may sense whether the electronic device ED is in the first mode or the second mode. In an embodiment, the sensor module SSM may include a motion detecting sensor for sensing an operation of the electronic device ED. In one embodiment, for example, the sensor module SSM may sense an operation of the case CS (e.g., see FIG. 1), using the motion detecting sensor. The sensor module SSM may sense a mode of the case CS and may determine whether the electronic device ED is in the first mode or the second mode, based on the sensed mode of the case CS. The sensor module SSM may determine whether the electronic device ED is in the first mode or the second mode, from the sensing of a sliding motion of the case CS. In an embodiment, when the motion detecting sensor senses a sliding motion of opening the first case CS1 (e.g., see FIG. 1) in the first direction DR1, the sensor module SSM may determine that the electronic device ED is in the second mode. In such an embodiment, when the motion detecting sensor senses a sliding motion of closing the first case CS1 in the second mode, the sensor module SSM may determine that the electronic device ED is in the first mode.

In an embodiment, the sensor module SSM may include a magnetic field sensing sensor. The sensor module SSM may be configured to sense whether there is an external wireless charging device near the electronic device ED. In one embodiment, for example, the sensor module SSM may sense a magnetic field strength between a wireless charging coil of the external wireless charging device and a wireless charging coil of the electronic device ED, using the magnetic field sensing sensor. When a magnetic field with a specific strength is sensed, the sensor module SSM may send a signal for an operation of sensing a mode of the electronic device ED to the control module CM. The control module CM may instruct the sensor module SSM to determine whether the electronic device ED is in the first mode or in the second mode. The sensor module SSM may determine whether the electronic device ED is in the first mode or the second mode, based on the mode of the case CS determined using the motion detecting sensor.

In an embodiment, the electronic module may include at least one of the elements constituting the first and second electronic modules EM1 and EM2. In one embodiment, for example, the second electronic module EM2 may include at least one of the audio output module AOM, the light-emitting module LM, the light-receiving module LRM, the camera module CMM, or a heat sensing module. The electronic module EM1, EM2 may sense information on an external object, or may provide an audio signal (e.g., voice) or light (e.g., infrared light) to the outside.

Figure 4A:
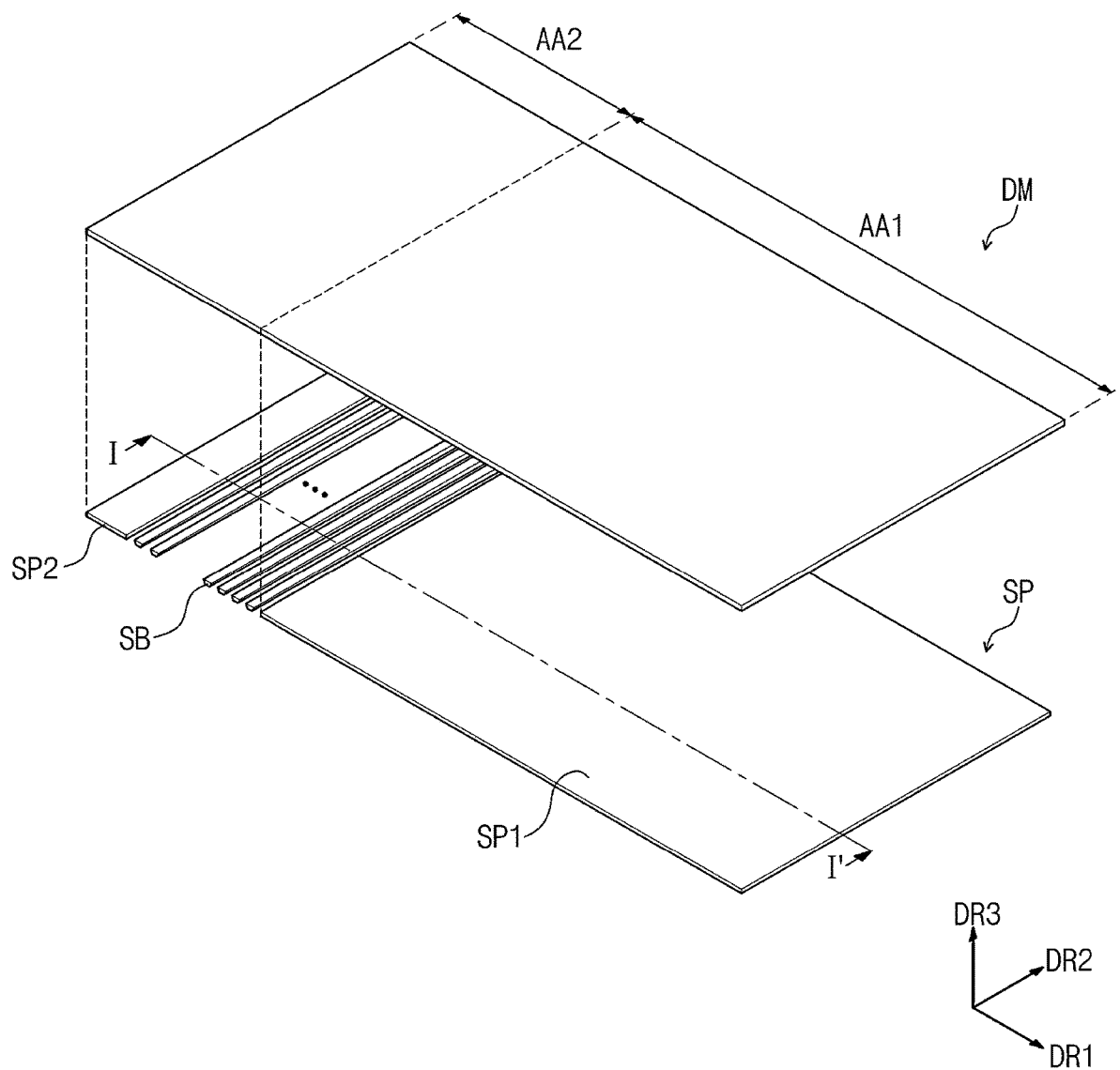
FIGS. 4A and 4B are views illustrating a display module and a supporting portion supporting the display module, according to an embodiment of the invention.
Figure 4B:
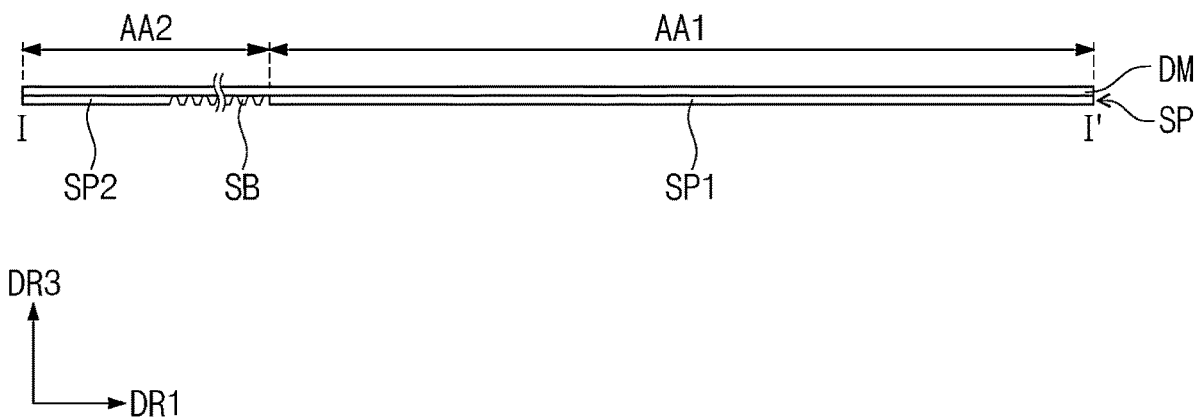

FIGS. 4A and 4B are views illustrating a display module and a supporting portion supporting the display module, according to an embodiment of the invention.

FIG. 4A is a perspective view illustrating the display module of FIG. 1 and a supporting member, which supports the display module. FIG. 4B is a side view illustrating the display module and the supporting member, which are shown in FIG. 4A.

For convenience in illustration, FIG. 4A illustrates the display module DM and a supporting member SP, which are separated from each other, and FIG. 4B illustrates a lateral structure of the display module DM and the supporting member SP viewed in the second direction DR2.

Referring to FIGS. 4A and 4B, in an embodiment, the display surface DS of the display module DM may include a first region AA1 and a second region AA2. The first region AA1 of the display surface DS may be provided to have a size corresponding to the display surface DS of FIG. 1 in a basic mode, thereby determining a size of a screen in the first mode. That is, in the first mode, the display surface DS may be defined as the first region AA1, and the second region AA2 may not be exposed to the outside. In an alternative embodiment, the first region AA1 and a portion of the second region AA2 may be exposed to the outside, in the first mode.

In an embodiment where the second region AA2 is adjacent to the first region AA1, when the electronic device ED is in the second mode, not only the first region AA1 but also at least a portion of the second region AA2 may be exposed to the outside. A size of a screen of the electronic device ED may be increased by the exposed area of the at least a portion of the second region AA2.

In the second mode, other portion of the second region AA2, except for the expose portion, may not be exposed to the outside. The other portion may correspond to a non-display region, which is not exposed to the outside in both of the first and second modes.

The supporting member SP may be disposed below the display module DM. The supporting member SP may include or be formed of a material having higher stiffness or lower flexibility than the display module DM. In an embodiment, the supporting member SP may be a metal plate (e.g., a plate including aluminum). The supporting member SP may include a first supporting portion SP1, a plurality of supporting bars SB, and a second supporting portion SP2. The first supporting portion SP1 may support the first region AA1 of the display module DM, and the supporting bars SB and the second supporting portion SP2 may support the second region AA2 of the display module DM.

The supporting bars SB may be disposed between the first supporting portion SP1 and the second supporting portion SP2. The supporting bars SB may be extended in the second direction DR2 and may be arranged in the first direction DR1. The supporting bars SB may be spaced apart from each other in the first direction DR1. In an embodiment, when viewed in the second direction DR2, each of the supporting bars SB may have a reversed trapezoidal shape.

FIGS. 4A and 4B illustrate an embodiment, in which the supporting bars SB are spaced apart from each other in the first direction DR1, but the structure of the supporting bars SB is not limited thereto. In one alternative embodiment, for example, the supporting bars SB may be rotatably or slantingly combined to each other via a joint structure.

The first supporting portion SP1 may have a planar surface that is defined by the first and second directions DR1 and DR2. The first supporting portion SP1 may have a size corresponding to the first region AA1 of the display module DM.

The second supporting portion SP2 may overlap the second region AA2. In the first mode, the second supporting portion SP2 may face the first supporting portion SP1. The second supporting portion SP2 may include a metal plate.

In an embodiment, as shown in FIGS. 4A and 4B, the supporting member SP may be disposed below the display module DM to support the display module DM. The supporting member SP may be disposed on a rear surface of the display module DM, which is opposite to the display surface DS.

The first supporting portion SP1 may be disposed on the rear surface of the display module DM to support the first region AA1 of the display module DM. The supporting bars SB and the second supporting portion SP2 may be disposed on the rear surface of the display module DM to support the second region AA2.

Although not shown, an adhesive may be disposed between the display module DM and the supporting member SP to attach the supporting member SP to the rear surface of the display module DM. In one embodiment, for example, the adhesive may include a pressure sensitive adhesive, but the invention is not limited thereto, and alternatively, the adhesive may include various adhesives.

Figure 5A:
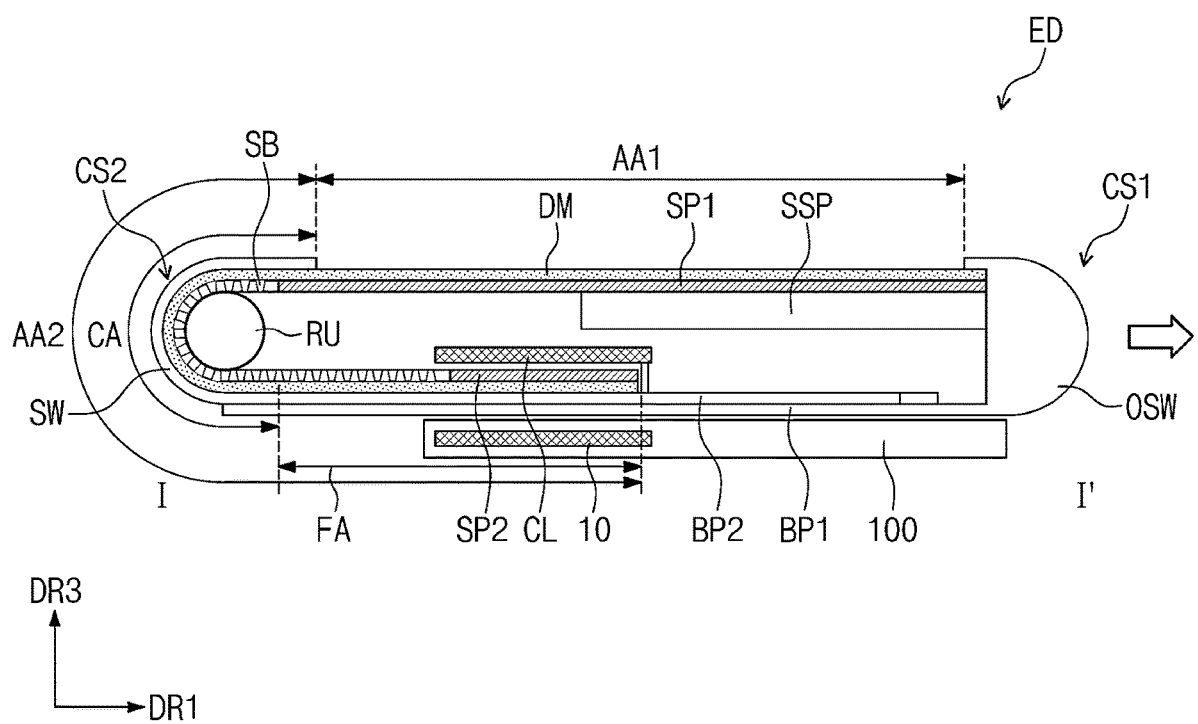
FIGS. 5A and 5B are sectional views illustrating an electronic device according to an embodiment of the invention.
Figure 5B:
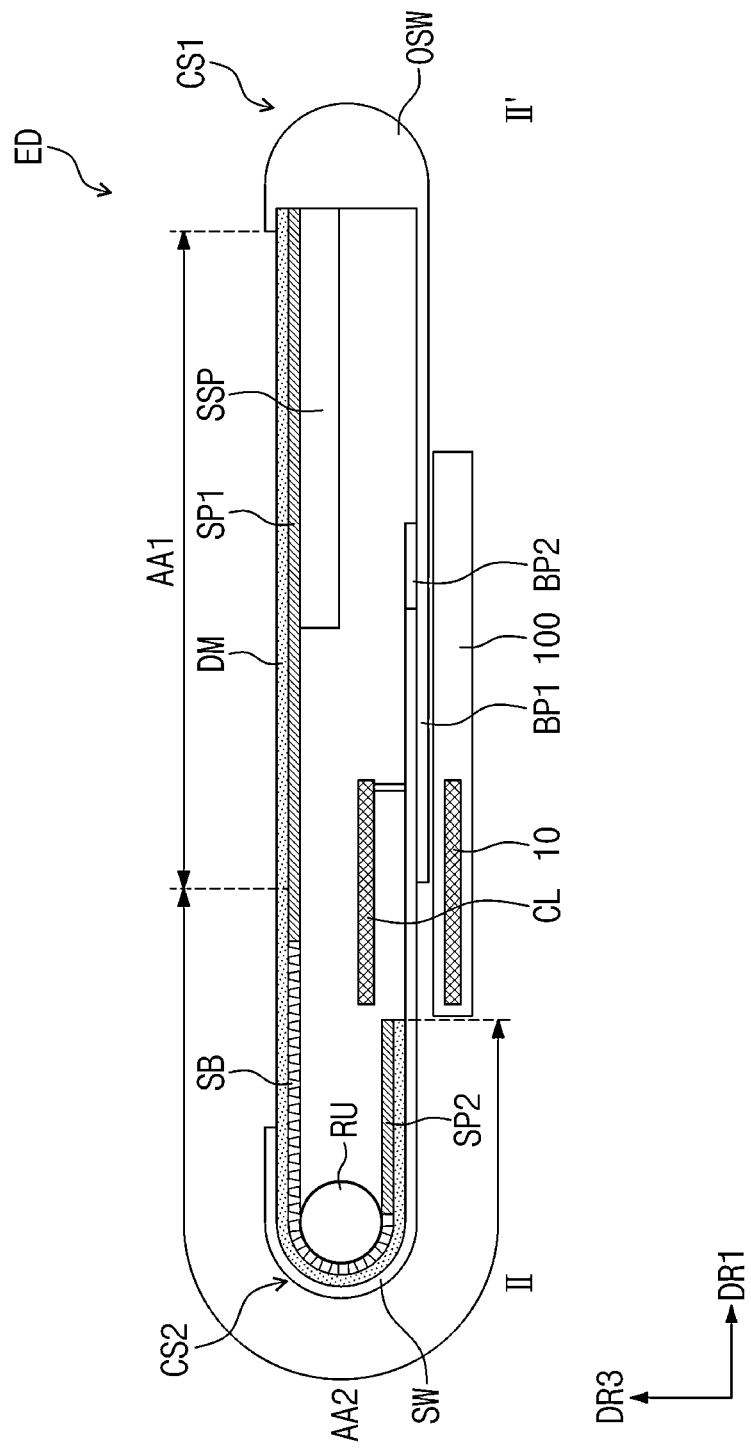

FIGS. 5A and 5B are sectional views illustrating an electronic device according to an embodiment of the invention.

FIG. 5A is a sectional view illustrating a cross-section taken along a line I-I' of FIG. 1. FIG. 5B is a sectional view illustrating a cross-section taken along a line II-II' of FIG. 2.

Referring to FIGS. 5A and 5B, an embodiment of the electronic device ED may include the display module DM, the supporting member SP, the case CS, and a wireless charging coil CL.

In an embodiment, the electronic device ED may be in a predetermined mode, i.e., the first mode and the second mode. The mode of the electronic device ED, that is, whether the electronic device ED is in the first mode or the second mode, may be determined by the sliding motion of the case CS. In an embodiment, the first mode of the electronic device ED may correspond to a case in which the first case CS1 and the second case CS2 are moved toward each other to have the minimum distance, and the second mode of the electronic device ED may correspond to a case in which the first case CS1 and the second case CS2 are moved away from each other to have the maximum distance.

In an embodiment, the mode of the electronic device ED may be determined based on a region of the display module DM exposed to the outside. In an embodiment, the display module DM may include the first region AA1 and the second region AA2. The first region AA1 may be exposed to the outside, in the first mode. The second region AA2 may be extended from the first region AA1. The second region AA2 may not be exposed to the outside, in the first mode.

In an embodiment, when the electronic device ED is in the first mode, the second region AA2 may include a curved region CA, which is curved with a specific radius of curvature, and a flat region FA, which is extended from the curved region CA to face the first region AA1. In an embodiment, as shown in FIG. 5B, at least a portion of the second region AA2 may be exposed to the outside, in the second mode. In an embodiment, the at least a portion of the second region AA2, which is exposed to the outside in the second mode, may correspond to the curved region CA in the first mode.

The supporting member SP may support the display module DM. The supporting member SP may include the first supporting portion SP1 and the second supporting portion SP2. The supporting member SP may include a metal plate. In an embodiment, the first supporting portion SP1 may support the first region AA1 of the display module DM, and the second supporting portion SP2 may support the flat region FA of the second region AA2 of the display module DM. The second supporting portion SP2 supporting the flat region FA may include a metal plate. The supporting member SP may include a plurality of the supporting bars SB. The supporting bars SB may support the curved region CA of the second region AA2.

In an embodiment, the supporting member SP may include a sub-supporting plate SSP. The sub-supporting plate SSP may be disposed on a rear surface of the supporting member SP to support the first supporting portion SP1. Although not illustrated in the drawings, a containing room for accommodating components (e.g., a battery, a driving device, or the like) may be defined or provided between the sub-supporting plate SSP and a first bottom portion BP1.

The case CS may contain the display module DM and the supporting member SP. The case CS may include the first case CS1 and the second case CS2. The second case CS2 may be combined to the first case CS1 in a way to allow the second case CS2 move away from or toward the first case CS1 in the first direction DR1.

The display module DM and the supporting member SP may be fixed and combined to the first case CS1. An repetitive description of features of the case CS described above with reference to FIGS. 1 to 4B will be omitted. The case CS may change the mode of the electronic device ED (e.g., from the first mode to the second mode or vice versa) through the sliding motion.

The first case CS1 may include a sidewall portion OSW and a bottom portion BP1. The second case CS2 may include a sidewall portion SW and a bottom portion BP2. In an embodiment, the display module DM and the supporting member SP may be fixed to the sidewall portion OSW of the first case CS1.

In an embodiment, the electronic device ED may include a rotation unit RU. The rotation unit RU may be disposed in the second case CS2 and may be combined to the second case CS2. In one embodiment, for example, the rotation unit RU may be combined to a sidewall portion SW of the second case CS2. The rotation unit RU may be rotatable even when it is combined to the sidewall portion SW. The rotation unit RU may be rotated by the sliding motion of the case CS, thereby expanding or shrinking the display surface DS (e.g., see FIG. 1).

The wireless charging coil CL may be disposed in the case CS. In an embodiment, the wireless charging coil CL may be fixed and coupled to the second case CS2. The wireless charging coil CL may be fixed to the bottom portion BP2 of the second case CS2, but the invention is not limited thereto and the wireless charging coil CL may be fixed to the bottom portion BP2 in various manners.

In an embodiment, as shown in FIGS. 5A and 5B, the wireless charging coil CL may be shielded by the supporting member SP, in the first mode. In such an embodiment, the wireless charging coil CL may be shielded by the metal plate of the second supporting portion SP2, when the case CS is in the first mode. The wireless charging coil CL may be opened from the supporting member SP, in the second mode. The wireless charging coil CL may be opened from the metal plate, when the case CS is in the second mode. In the first mode, the wireless charging coil CL may be disposed to overlap the first supporting portion SP1 and the second supporting portion SP2 in the third direction DR3. In the second mode, the wireless charging coil CL may be disposed to overlap the first supporting portion SP1 in the third direction DR3 but may not overlap the second supporting portion SP2. In the second mode, the wireless charging coil CL may overlap at least a portion of the second region AA2 exposed to the outside.

In an embodiment, the wireless charging coil CL may be electrically connected to the wireless charging module WRM (e.g., see FIG. 3). The wireless charging coil CL may be inactivated when the wireless charging coil CL is shielded by the metal plate of the second supporting portion SP2, and the wireless charging coil CL may be activated when not overlapping the second supporting portion SP2. In such an embodiment, the wireless charging coil CL may be activated or inactivated by the wireless charging module WRM. In such an embodiment, the wireless charging coil CL may be primarily activated or inactivated by the metal plate of the second supporting portion SP2 and may be secondarily activated or inactivated by the control of the wireless charging module WRM.

The wireless charging coil CL may charge the electronic device ED in an electromagnetic manner or through an electromagnetic interaction with a transceiver coil 10 of an external wireless charging device 100. When the wireless charging coil CL is disposed to overlap the transceiver coil 10 of the external wireless charging device 100 in the third direction DR3, a magnetic field may be produced, and an induction current generated thereby may be used to charge the electronic device ED. In an embodiment, the external wireless charging device 100 may be disposed to be in contact with or to be adjacent to the bottom portion BP1 of the first case CS1, such that the transceiver coil 10 is aligned to the wireless charging coil CL.

As shown in FIG. 5A, in the first mode, the metal plate of the second supporting portion SP2 may be disposed between the wireless charging coil CL and the transceiver coil 10 to inactivate the wireless charging coil CL. As shown in FIG. 5B, in the second mode, the metal plate may not be disposed between the wireless charging coil CL and the transceiver coil 10. Thus, the wireless charging coil CL may be activated in the second mode. An repetitive detailed description of the wireless charging module WRM will be omitted.

Figure 6:
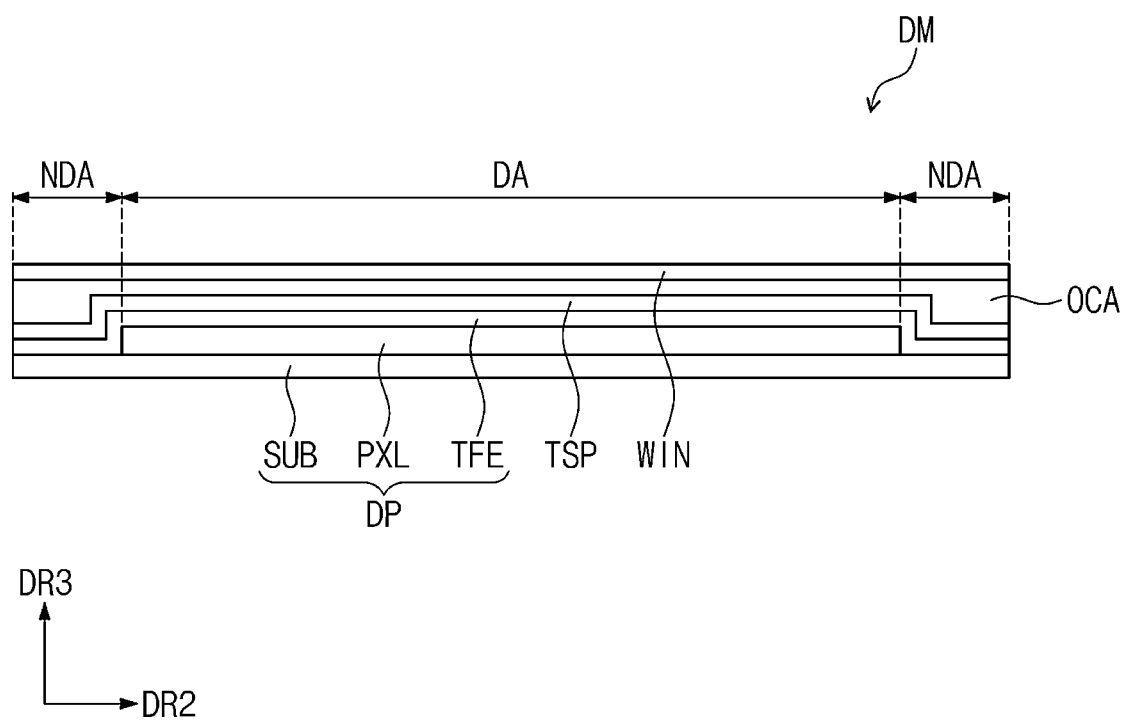
FIG. 6 is a schematic sectional view of the display module shown in FIG. 1.

FIG. 6 is a schematic sectional view of the display module shown in FIG. 1.

Referring to FIG. 6, an embodiment of the display module DM may include a display panel DP, a touch sensing portion TSP disposed on the display panel DP, a window WIN disposed on the touch sensing portion TSP, and an adhesive OCA disposed between the touch sensing portion TSP and the window WIN.

In an embodiment, the display panel DP may be an organic light emitting display panel. However, the invention is not limited thereto, and various types of image display panels, such as a liquid crystal display panel, an electrowetting display panel, and an electrophoretic display panel, may be used as the display panel DP. The display panel DP may be a flexible display panel.

The display panel DP may include a substrate SUB, a pixel layer PXL disposed on the substrate SUB, and a thin encapsulation layer TFE disposed on the substrate SUB to cover the pixel layer PXL. The substrate SUB may be a transparent substrate and may include a flexible plastic substrate. In one embodiment, for example, the substrate SUB may include polyimide ("PI").

The substrate SUB may include a display region DA and a non-display region NDA around the display region DA. The pixel layer PXL may be disposed on the display region DA. The pixel layer PXL may include a plurality of pixels, each of which includes a light-emitting device.

The thin encapsulation layer TFE may include at least two inorganic layers and an organic layer disposed between the inorganic layers. The inorganic layers may include an inorganic material and may protect the pixel layer PXL from moisture or oxygen. The organic layer may include an organic material and may protect the pixel layer PXL from a contamination material such as dust particles.

The touch sensing portion TSP may be disposed on the thin encapsulation layer TFE. The touch sensing portion TSP may sense an external input (e.g., a user's hand, a touch pen, or the like) and may convert the external input to an input signal. The touch sensing portion TSP may include a plurality of sensing electrodes, which are used to sense the external input. The sensing electrodes may sense the external input in a capacitance manner.

The touch sensing portion TSP may be formed or provided directly on the thin encapsulation layer TFE, when the display module DM is manufactured. However, the invention is not limited thereto, and the touch sensing portion TSP may be manufactured as a touch panel, separately from the display panel DP, and may be attached to the display panel DP by an adhesive.

The window WIN may protect the display panel DP and the touch sensing portion TSP from an external scratch and an external impact. The window WIN may be attached to the touch sensing portion TSP by the adhesive OCA. The adhesive OCA may include an optical clear adhesive. An image output by the display panel DP may be provided to a user through the window WIN.

Figure 7:
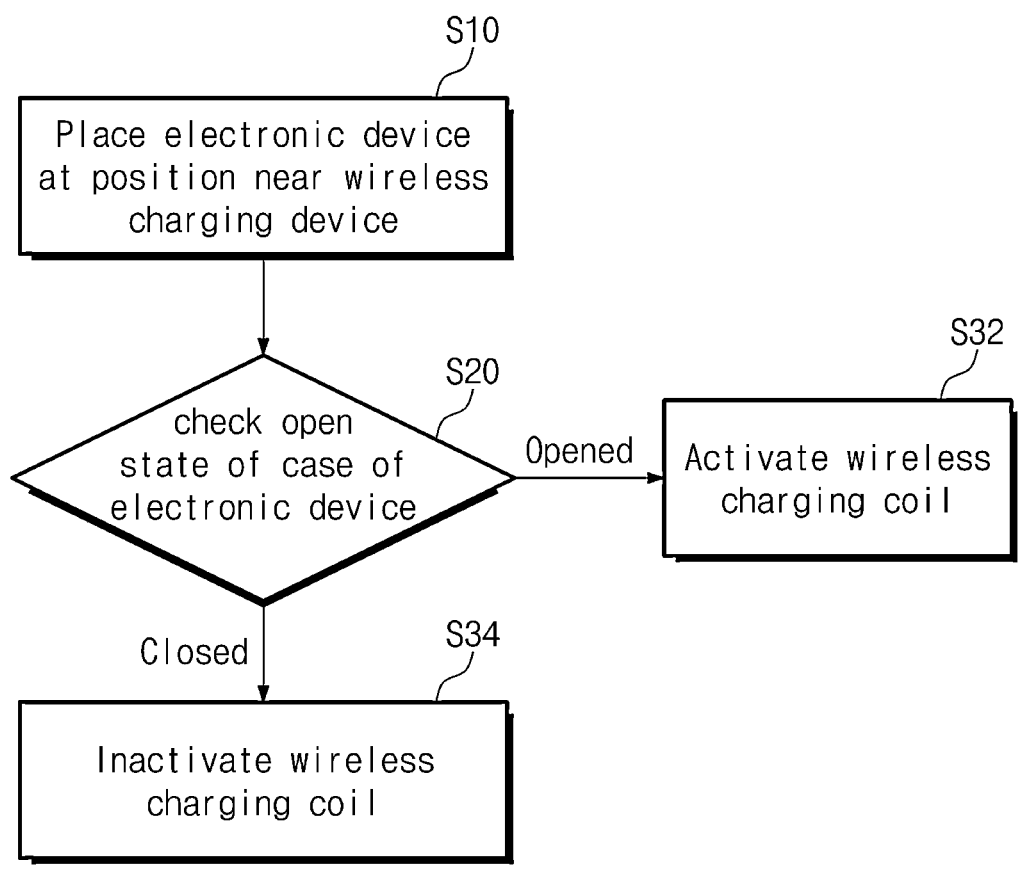
FIG. 7 is a flow chart illustrating a method of charging an electronic device according to an embodiment of the invention.

FIG. 7 is a flow chart illustrating a method of charging an electronic device according to an embodiment of the invention.

In an embodiment, as shown in FIG. 7, the method of charging an electronic device may be performed to charge an electronic device in a wireless charging manner.

In an embodiment, when a distance between the electronic device ED and the external wireless charging device 100 (e.g., see FIG. 5A) is reduced, the sensor module SSM (e.g., see FIG. 3) of the electronic device ED (e.g., see FIG. 1) may sense a magnetic field strength between the wireless charging coil CL (e.g., see FIG. 5A) and the transceiver coil 10 of the external wireless charging device 100 (in S10). In one embodiment, for example, the sensor module SSM may sense the magnetic field strength using the magnetic field sensing sensor. The magnetic field strength sensed by the sensor module SSM may be used to determine whether the electronic device ED (or the case CS) is in the first mode or in the second mode.

After the sensing the magnetic field strength between the wireless charging coil CL (e.g., see FIG. 5A) and the transceiver coil 10 of the external wireless charging device 100, the sensor module SSM may determine whether the electronic device ED (or the case CS) is in the first or the second mode (in S20). In one embodiment, for example, the sensor module SSM may determine whether the electronic device ED is in the first mode or the second mode, based on the sliding motion of the case CS (e.g., see FIG. 5A), using a motion detecting sensor.

Thereafter, when the electronic device ED is determined as being in the second mode, the control module CM may receive a signal from the sensor module SSM and may send a signal to the wireless charging module WRM (e.g., see FIG. 3) to activate the wireless charging coil CL (e.g., see FIG. 5A) (in S32).

When the electronic device ED is determined as being in the first mode, the wireless charging module WRM may be inactivated and the wireless charging coil CL may be also inactivated (in S34).

Figure 8A:
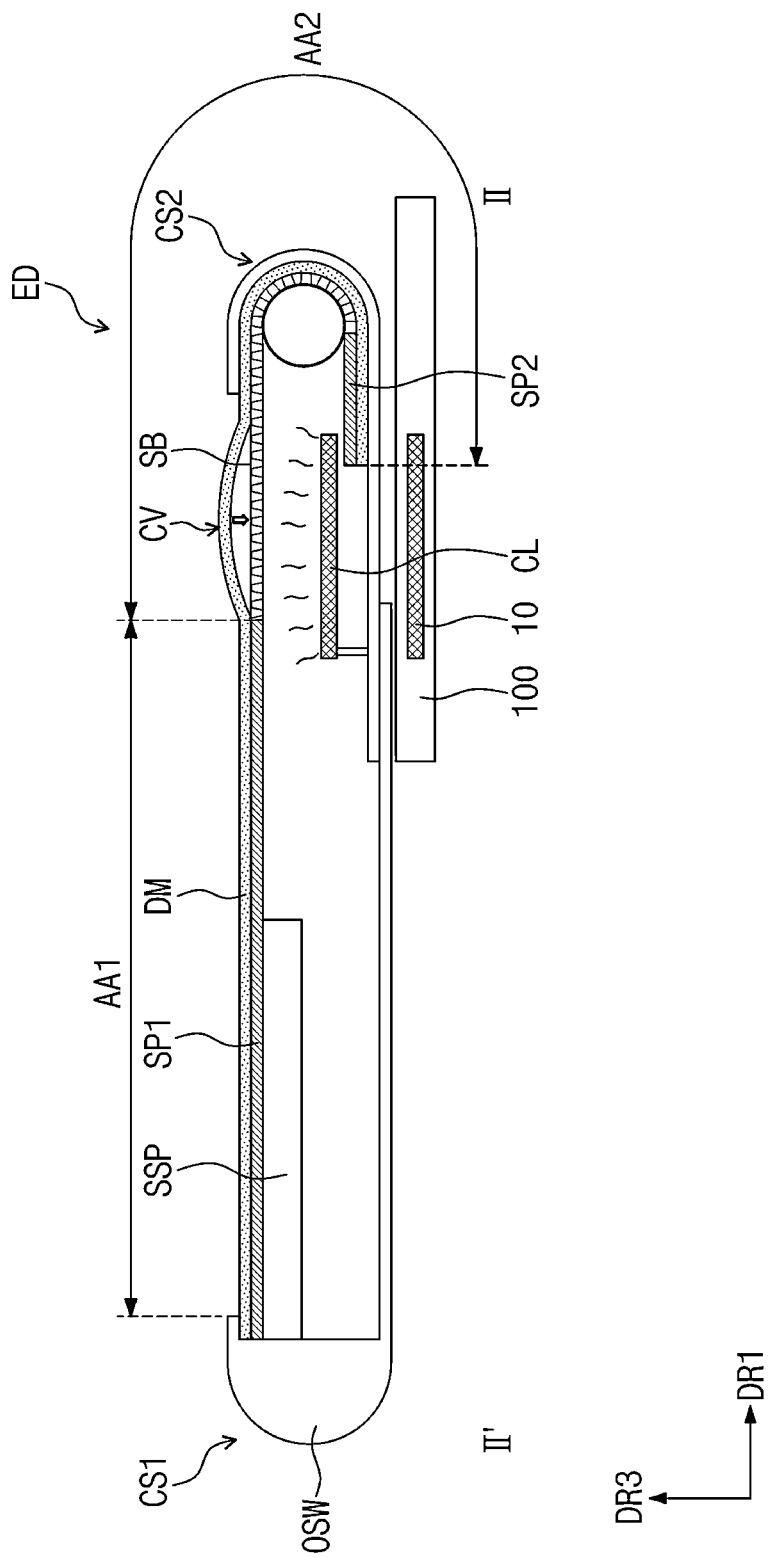
FIGS. 8A and 8B are sectional views illustrating a method of charging an electronic device according to an embodiment of the invention.
Figure 8B:
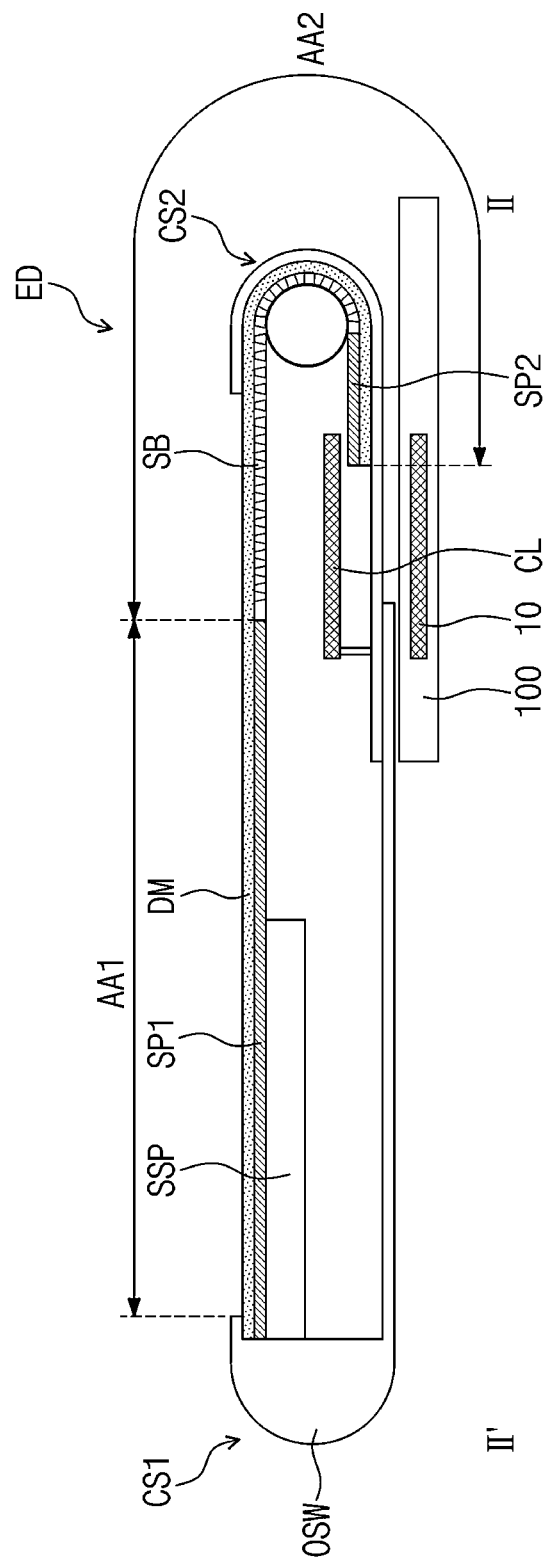

FIGS. 8A and 8B are sectional views illustrating a method of charging an electronic device according to an embodiment of the invention.

FIG. 8A is a diagram illustrating a wireless charging process, in which the electronic device ED receives an electric power from the external wireless charging device 100 adjacent thereto. FIG. 8B is a diagram illustrating a flattening process of the display module DM and the supporting member SP, which occurs in the wireless charging process. In an embodiment, if the wireless charging coil CL is activated, the wireless charging step may be initiated and the electronic device ED may receive an electric power from the external wireless charging device 100. The wireless charging coil CL may generate heat, during the wireless charging step. The heat generated by the wireless charging coil CL may be used to flatten a curved portion CV, which is formed in the display module DM adjacent thereto. Here, the curved portion CV in the display module DM may be formed in a portion of the second region of the display module DM, which overlap the curved region CA (e.g., see FIG. 5A) in the first mode of the electronic device ED. The curved portion CV may have a curved shape protruding in a direction away from the wireless charging coil CL (e.g., in the third direction DR3). Although not shown, the curved portion CV may be also formed in the supporting member SP disposed below the display module DM. In such an embodiment, the curved portion CV of the supporting member SP may be planarized by heat generated from the wireless charging coil CL during the wireless charging step. The curved portion CV of the supporting member SP may be formed near the supporting bars SB, which are disposed on the rear surface of the display module DM and overlaps a portion of the second region of the display module DM overlapping the curved region CA (e.g., see FIG. 5A) in the first mode.

Figure 9:
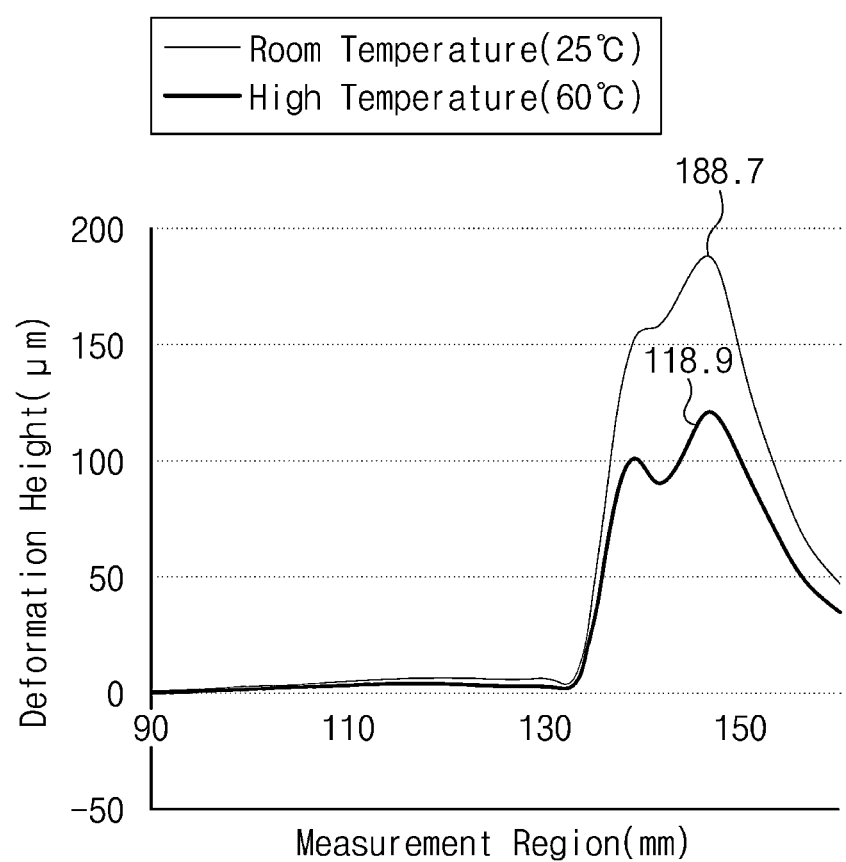
FIG. 9 is a graph showing changes in deformation height of a curved portion of a display module at two different temperatures, according to an embodiment of the invention.

FIG. 9 is a graph showing changes in deformation height of the curved portion CV of a display module at two different temperatures, according to an embodiment of the invention.

Referring to FIG. 9, a protruding height (hereinafter, a deformation height) of the curved portion CV (e.g., see FIG. 8A), which is formed in the display module DM at a room temperature (e.g., about 25° C.) may be about 188.7 micrometers (μm). However, a deformation height of the curved portion CV, which is formed in the display module DM at a high temperature (e.g., about 60° C.) may be about 118.9 μm. Here, the room temperature may correspond to a temperature of the electronic device ED when the wireless charging step is not performed on the electronic device ED in the second mode, and the high temperature of about 60°

C. may correspond to a temperature of the electronic device ED when the wireless charging step is performed in the second mode.

In FIG. 9, in an embodiment of the electronic device ED, a curved deformation issue in the display module DM and the supporting member SP may be relieved using heat generated in the wireless charging step. Thus, according to an embodiment of the invention, the wireless charging process may be restrictively activated in the second mode, in which the curved deformation of the electronic device ED is exposed, such that a failure of the electronic device caused by the curved deformation may be effectively relieved or prevented.

In embodiments of an electronic device and a method of charging the electronic device according to the invention, a wireless charging operation is selectively performed only in a second mode, to prevent a curved deformation issue from occurring on a display panel.

According to embodiments of the invention, due to a metal supporting member, which is configured to shield a wireless charging coil in a first mode and to expose the wireless charging coil in a second mode, the wireless charging operation is selectively performed only in the second mode.

According to embodiments of the invention, due to a wireless charging module, which activates the wireless charging operation when the second mode is sensed and inactivate the wireless charging operation when the first mode is sensed, the wireless charging operation is selectively performed only in the second mode.

According to an embodiment of the invention, heat generated in the wireless charging operation may be used to flatten a curved portion of a display panel, which is produced in the second mode.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device, comprising:
 a display module including a first region, which is exposed to an outside in a first mode and a second mode, and a second region extending from the first region, wherein a portion of the second region is opposite to the first region in the first mode, a portion of the second region is exposed to the outside in the second mode, and the second region comprises a curved region having a specific curvature in the first mode and a flat region extending from the curved region and opposite to the first region;
 a supporting member disposed below the display module to support the display module;
 a case which contains the display module and the supporting member, wherein the first mode and the second mode are determined based on a sliding motion of the case; and
 a wireless charging coil contained in the case, wherein the wireless charging coil is shielded by the supporting member in the first mode, and does not overlap the supporting member in the second mode.

2. The electronic device of claim 1, wherein the supporting member comprises:
 a first supporting portion overlapping the first region; and
 a second supporting portion overlapping the second region, wherein the second supporting portion faces the first supporting portion in the first mode,
 wherein the second supporting portion comprises a metal plate.

3. The electronic device of claim 2, wherein
 the wireless charging coil overlaps the first supporting portion and the second supporting portion in the first mode, and
 the wireless charging coil overlaps the first supporting portion and does not overlap the second supporting portion in the second mode.

4. The electronic device of claim 1, wherein
 the wireless charging coil is inactivated when the wireless charging coil is shielded by the supporting member, and
 the wireless charging coil is activated when the wireless charging coil does not overlap the supporting member.

5. The electronic device of claim 1, further comprising:
 a wireless charging module electrically connected to the wireless charging coil,
 wherein the wireless charging module activates the wireless charging coil in the second mode and inactivates the wireless charging coil in the first mode.

6. The electronic device of claim 5, further comprising:
 an electronic module electrically connected to the display module and the wireless charging module,
 wherein the electronic module comprises a sensor module, which senses whether the electronic device is in the first mode or the second mode to produce state information and transmits the produced state information to the wireless charging module.

7. The electronic device of claim 6, wherein the sensor module senses the sliding motion of the case to sense whether the electronic device is in the first mode or the second mode.

8. The electronic device of claim 6, wherein the case comprises a first case, to which the display module and the supporting member are fixed and combined, and a second case, which is combined to the first case and is movable toward or away from the first case in a predetermined direction.

9. The electronic device of claim 8, wherein
 the sensor module senses that the electronic device is in the second mode when the second case moves away from the first case, and
 the sensor module senses that the electronic device is in the first mode when the second case moves toward the first case.

10. The electronic device of claim 8, wherein the wireless charging coil is fixed and combined to the second case.

11. The electronic device of claim 1, wherein
 the portion of the second region exposed to the outside in the second mode corresponds to the curved region in the first mode, and
 the wireless charging coil overlaps the portion of the second region exposed to the outside in the second mode.

12. The electronic device of claim 5, wherein, in the first mode, the wireless charging coil is inactivated by the supporting member and is inactivated by the wireless charging module.

13. A method of charging an electronic device, wherein the electronic device comprises a display module, a supporting member which supports the display module, a case which contains the display module and the supporting member, and a wireless charging module, the method comprising:
- sensing a sliding motion of the case;
- determining whether the case is in a first mode or in a second mode based on the sliding motion thereof; and
- activating the wireless charging module when the case is in the second mode.

14. The method of claim 13, wherein
the electronic device further comprises an electronic module connected to the display module and the wireless charging module,
wherein the electronic module comprises:
- a control module which determines whether the case is in the first mode or in the second mode; and
- a sensor module which senses whether the case is in the first mode or in the second mode.

15. The method of claim 13, wherein the determining whether the case is in the first mode or in the second mode comprises sensing an external wireless charging device adjacent to the electronic device.

16. The method of claim 13, wherein the case comprises a first case, to which the display module and the supporting member are fixed and combined, and a second case, which is combined to the first case and is movable toward or away from the first case in a predetermined direction, and the determining whether the case is in the first mode or in the second mode comprises determining that the case is in the second mode when the second case moves away from the first case and determining that the case is in the first mode when the second case moves toward the first case.

17. The method of claim 13, further comprising:
activating a wireless charging coil electrically connected to the wireless charging module.

18. The method of claim 13, further comprising:
performing a wireless charging process, in which the electronic device receives an electric power from an external wireless charging device adjacent thereto, when the wireless charging module is activated.

19. The method of claim 18, wherein the performing the wireless charging process comprises deforming the display module to flatten a curved portion of the display module, using heat generated in a process of receiving the electric power.

20. The method of claim 13, wherein
the supporting member shields a wireless charging coil, which is electrically connected to the wireless charging module, in the first mode of the case, and
the supporting member does not overlap the wireless charging coil in the second mode of the case.

* * * * *